(12) United States Patent
Kim et al.

(10) Patent No.: US 7,682,900 B2
(45) Date of Patent: Mar. 23, 2010

(54) METHOD OF FABRICATING FLASH MEMORY DEVICE

(75) Inventors: Eun Soo Kim, Incheon-Si (KR); Whee Won Cho, Chungcheonbuk-do (KR); Seung Hee Hong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 61 days.

(21) Appl. No.: 11/964,298

(22) Filed: Dec. 26, 2007

(65) Prior Publication Data
US 2009/0004814 A1 Jan. 1, 2009

(30) Foreign Application Priority Data
Jun. 28, 2007 (KR) .................. 10-2007-0064533

(51) Int. Cl.
*H01L 21/336* (2006.01)
(52) U.S. Cl. .............. 438/257; 438/201; 438/211; 438/279; 438/424
(58) Field of Classification Search .......... 438/424, 438/437, 264, 259, 201, 211, 257, 279; 257/266, 257/365, 315, E21.54, E31.68; 365/53, 185.02, 365/185.29
See application file for complete search history.

(56) References Cited

U.S. PATENT DOCUMENTS

2005/0180186 A1 * 8/2005 Lutze et al. ............. 365/53
2007/0001212 A1 * 1/2007 Lee et al. ............. 257/315
2007/0064496 A1 * 3/2007 Oh ........................ 365/185.29
2007/0184615 A1 * 8/2007 Brazzelli et al. ........ 438/266
2009/0067234 A1 * 3/2009 Jeon et al. .............. 365/185.02

FOREIGN PATENT DOCUMENTS

| KR | 10-2003-0096875 | 12/2003 |
|---|---|---|
| KR | 10-2004-0033363 | 4/2004 |
| KR | 10-2006-0076506 | 7/2006 |
| KR | 10-2007-0002302 | 1/2007 |

* cited by examiner

*Primary Examiner*—A. Sefer
*Assistant Examiner*—Farid Khan
(74) *Attorney, Agent, or Firm*—Marshall, Gerstein & Borun LLP

(57) ABSTRACT

The invention relates to a method of fabricating a flash memory device. According to the method, select transistors and memory cells are formed on, and junctions are formed in a semiconductor substrate. The semiconductor substrate between a select transistor and an adjacent memory cell are over etched using a hard mask pattern. Accordingly, migration of electrons can be prohibited and program disturbance characteristics can be improved. Further, a void is formed between the memory cells. Accordingly, an interference phenomenon between the memory cells can be reduced and, therefore, the reliability of a flash memory device can be improved.

11 Claims, 3 Drawing Sheets

METHOD OF FABRICATING FLASH MEMORY DEVICE

CROSS-REFERENCE TO RELATED APPLICATION

Priority to Korean patent application number 10-2007-64533, filed on Jun. 28, 2007, which is incorporated by reference in its entirety, is claimed.

BACKGROUND OF THE INVENTION

The invention relates to a method of fabricating a flash memory device and, more particularly, to a method of fabricating a flash memory device that reduces disturbance between gates.

A flash memory device includes a cell region including a memory cell, and a peripheral ("peri") region including transistors for transferring a driving voltage. The cell region is described in detail below.

The cell region comprises strings having a plurality of memory cells connected in series. Each string includes a plurality of memory cells and a select transistor formed at both ends of the string. The memory cell has a structure in which a tunnel insulating film, a floating gate, a dielectric layer, and a control gate are sequentially laminated over a semiconductor substrate. Meanwhile, the select transistor has the same structure as that of the memory cell, but has a floating gate and a control gate in contact with each other through a contact hole formed in the dielectric layer.

Memory cells included in different strings share word lines and are connected to each other, and they are operated in response to voltage applied to the word lines. Select transistors included in different strings are connected through a select line and are operated in response to voltage applied to the select line.

In particular, in the case of a NAND flash memory device, as the level of integration increases, the distance between memory cells narrows. Thus, an interference phenomenon may occur between adjacent memory cells. The interference phenomenon is generally generated between adjacent floating gates and may also be generated due to an increased capacitance between the floating gates.

When a program operation in a flash memory device is performed, a program disturbance characteristic may be degraded. This is described in more detail below.

The program operation is performed by applying a program voltage to a selected word line in order to inject electrons into the floating gate of a selected memory cell. However, since a plurality of memory cells are connected to the word line, the program operation may be performed even on the memory cells on which the program operation should not be performed. To prevent this problem, channel boosting is generated in strings on which the program operation should not be performed so as to prevent electrons from being introduced to the floating gate.

Upon channel boosting, a junction region between the source select transistor and an adjacent memory cell is boosted to a specific voltage (for example, 8V) and a gate of the source transistor is grounded. In this condition, a gate induced drain leakage (GIDL) may be generated at a portion where the source select transistor and the junction overlap each other. Of an electron-hole pair generated in the junction, electrons can rapidly migrate to a channel region to which a high bias is applied. This degrades a program disturbance characteristic. In particular, this phenomenon is very pronounced between the select transistor and an adjacent memory cell.

BRIEF SUMMARY OF THE INVENTION

The invention can prohibit electrons from migrating from a select transistor to a channel region of a memory cell by forming the select transistors and the memory cells, forming junctions in a semiconductor substrate, and then over etching the semiconductor substrate between the select transistor and an adjacent memory cell using a hard mask pattern.

According to an embodiment of the invention, there is provided a method of fabricating a flash memory device. According this method, a semiconductor substrate comprising gates is provided. Junctions are formed in the semiconductor substrate between the gates. A hard mask pattern is formed on the gates so that an overhang is generated. A first etch process to remove the hard mask pattern formed between the gates is performed, thus exposing the junctions. A second etch process to make a bottom between the gates lower than a top surface of the semiconductor substrate is performed. An insulating layer is formed to gap-fill regions between adjacent gates.

According to another embodiment of the invention, a method of fabricating a flash memory device is provided. According this method, a semiconductor substrate comprising select transistors and memory cells and having junctions formed in the semiconductor substrate is provided. A hard mask pattern is formed so that a void is formed between adjacent memory cells. A first etch process to remove the hard mask pattern formed on a bottom between adjacent select transistors and memory cells is performed, thus exposing the junctions. A second etch process to make the bottom between the adjacent select transistors and memory cells lower than a top surface of the semiconductor substrate is performed. An insulating layer is formed to gap-fill regions between the adjacent select transistors and memory cells.

The hard mask pattern is preferably formed from a layer having poor step coverage. The layer having poor step coverage preferably comprises an Undoped Silicate Glass (USG) layer or a Tetra Ethyl Ortho Silicate (TEOS) layer.

The hard mask pattern is preferably formed to a thickness of 800 angstroms to 1000 angstroms. The hard mask pattern, which is formed on the bottom between the select transistor and the memory cell, is preferably thinner than that formed on top surfaces of the select transistor and the memory cell.

The depth of the bottom between the select transistor and memory cell is preferably lower than the top surface of the semiconductor substrate, and higher than a depth of the junction.

According to still another embodiment of the invention, a method of fabricating a flash memory device is provided. According this method, a semiconductor substrate comprising a gate having a first width, a gate having a second width, and a gate having a third width, which widths are different from one another, is provided. A hard mask pattern is formed on a total surface including the gates so that an overhang is generated on an upper side of the gate having the third width. An etch process is performed to expose the semiconductor substrate within the gate having the second width. An insulating layer is formed within the gate having the first width and the gate having the second width, and on a top of the gate having the third width. Preferably, the second width is narrower than the first width, and the third width is narrower the second width.

In the formation of the hard mask pattern, the hard mask pattern preferably covers on the top surface of the gate having the third width and a void is generated on a lower side of the gate having the third width. The etch step preferably is performed using a dry etch process.

DESCRIPTION OF SPECIFIC EMBODIMENTS

A specific embodiment according to the invention is described below with reference to the accompanying drawings.

However, the invention is not limited to the disclosed embodiment, and may be implemented in various other embodiments. The embodiment is provided to complete the disclosure of the invention and to allow those having ordinary skill in the art to understand the scope of the invention. The invention is defined by the appended claims.

FIGS. 1A to 1E are sectional views illustrating a method of fabricating a flash memory device according to the invention.

Figure 1A:
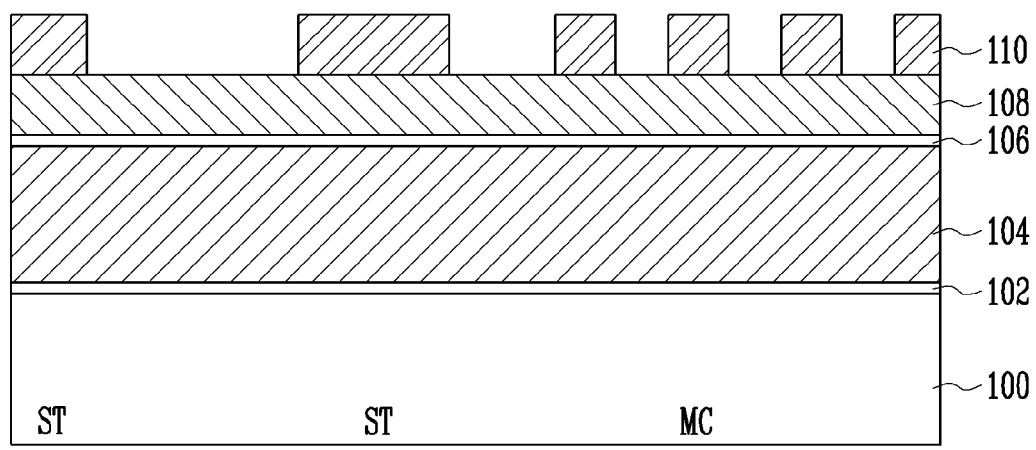
FIGS. 1A to 1E are sectional views illustrating a method of fabricating a flash memory device according to the invention.

Referring to FIG. 1A, a first insulating layer 102 for a tunnel insulating film (or a gate insulating layer), a first conductive layer 104 for a floating gate, a dielectric layer 106, and a second conductive layer 108 for a control gate are formed over a semiconductor substrate 100. The first insulating layer 102 may be formed from an oxide layer and the first conductive layer 104 may be formed from a polysilicon layer. The dielectric layer 106 may have a stack structure of a first oxide layer, a nitride layer and a second oxide layer (i.e., ONO layer). The second conductive layer 108 may be formed from a polysilicon layer, or by stacking a polysilicon layer and a metal layer. Though not shown in the drawings, after the first conductive layer 104 is formed, a trench is formed in an isolation region and an isolation layer is formed within the trench. A first hard mask pattern 110 for gate patterning is formed the second conductive layer 108.

Figure 1B:
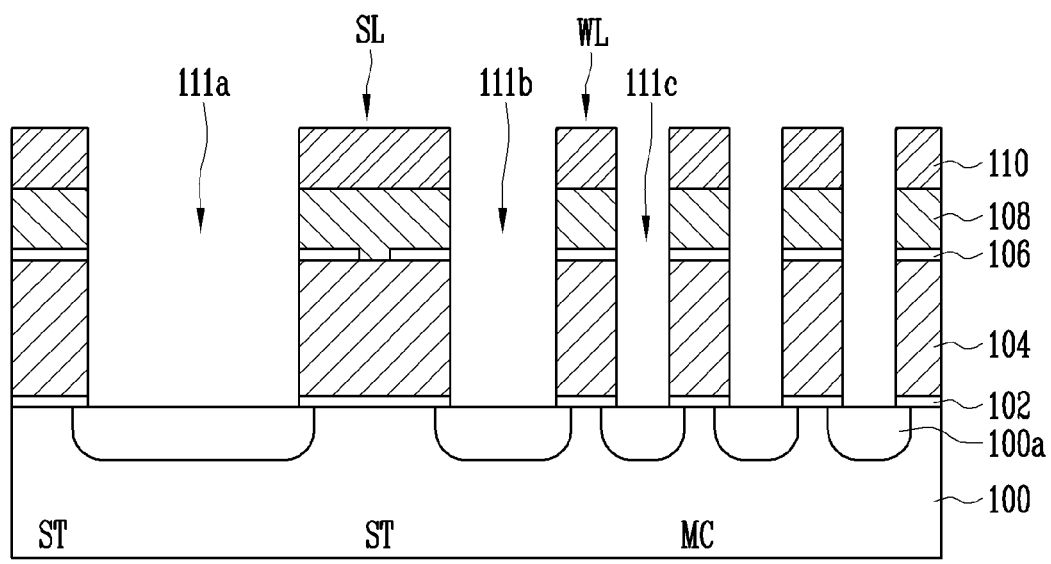

Referring to FIG. 1B, the second conductive layer 108, the dielectric layer 106, the first conductive layer 104, and the first insulating layer 102 are sequentially patterned by performing an etch process using the first hard mask pattern 110 as an etch mask, thus forming a gate pattern.

Accordingly, a select line SL of a select transistor ST and a word line WL of a memory cell MC are formed. At this time, the region between adjacent select lines SL is referred to as a first region 111a, the region between the select line SL and the word line WL is referred to as a second region 111b, and the region between adjacent word lines WL is referred to as a third region 111c. As illustrated, the width of the first region 111a is a first width, the width of the second region 111b is a second width, and the width of the third region 111c is a third width. The second width is narrower than the first width, but wider than the third width. Accordingly, the select transistors ST and the memory cells MC are formed.

An ion implantation process is then performed on the exposed semiconductor substrate 100, thus forming junctions 100a.

Figure 1C:
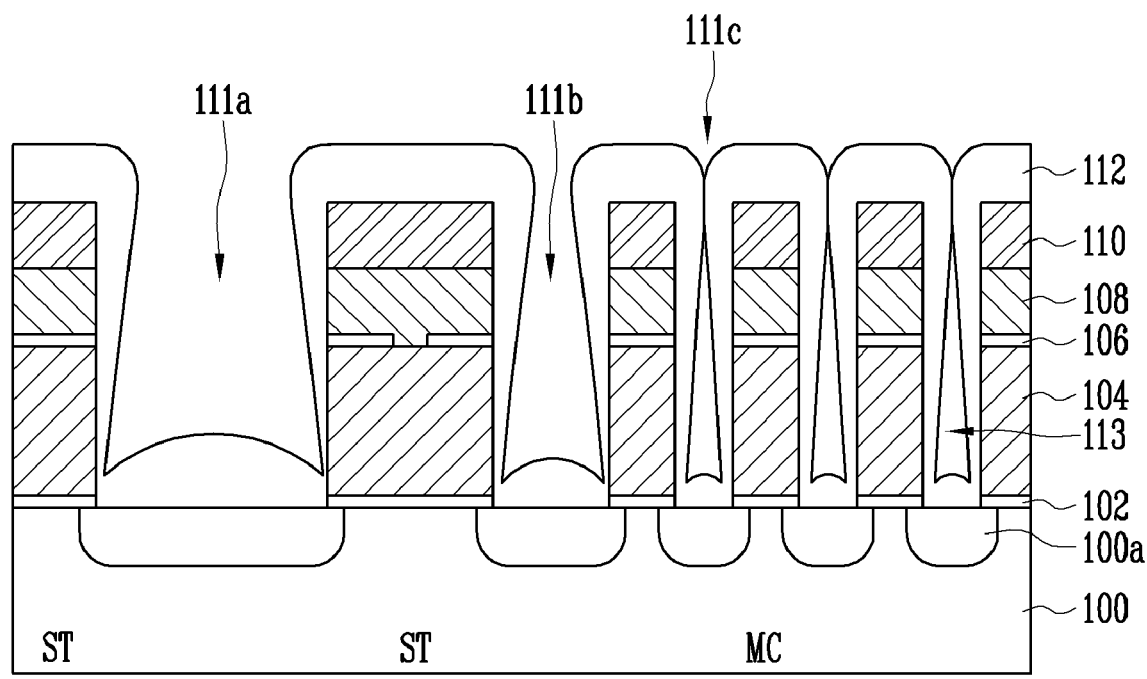

Referring to FIG. 1C, a second hard mask pattern 112 is formed over the entire surface including the semiconductor substrate 100 in which the select transistors ST and the memory cells MC are formed.

The second hard mask pattern 112 may be formed from a material (or method) having poor step coverage in order to generate overhang. For example, the second hard mask pattern 112 may be formed from Undoped Silicate Glass (USG) or Tetra Ethyl Ortho Silicate (TEOS). The second hard mask pattern 112 may be formed sufficiently thickly, for example, to a thickness of 800 angstroms to 1000 angstroms such that an upper side of the third region 111c between the memory cells MC is clogged due to overhang and a void 113 is generated at a lower side of the third region 111c. Thus, the void 113 (i.e., air), is formed between the memory cells MC, so an interference phenomenon can be reduced.

The width of the second region 111b is narrower than that of the first region 111a. Thus, the second hard mask pattern 112 formed at the bottom of the second region 111b is thinner than the second hard mask pattern 112 formed at the bottom of the first region 111a.

Figure 1D:
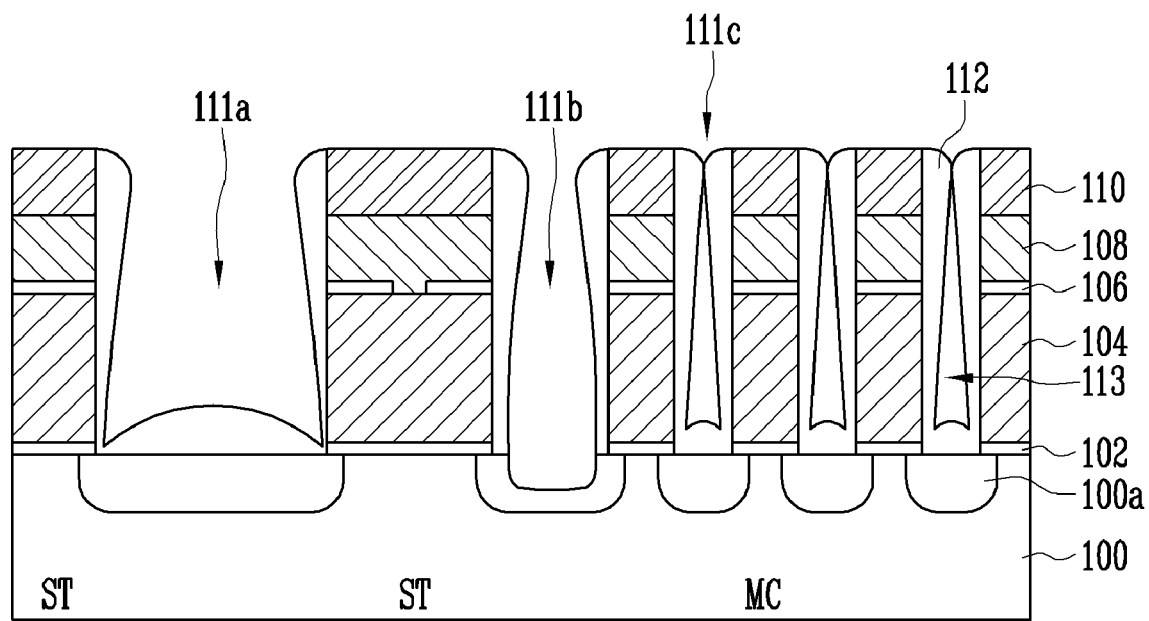

Referring to FIG. 1D, the second hard mask pattern 112 is etched so that the first hard mask pattern 110 is exposed. The etch process may be performed using a dry etch process. While the second hard mask pattern 112 formed on the tops of the select transistor ST and the memory cell MC is etched, the second hard mask pattern 112 formed on the bottoms of the first region 111a and the second region 111b is also etched. At this time, the second hard mask pattern 112 formed on the bottoms of the first region 111a and the second region 111b are removed earlier than the second hard mask pattern 112 formed on the tops of the first region 111a and the second region 111b because the thickness of the second hard mask pattern 112 formed on the bottoms of the first region 111a and the second region 111b is smaller than that of the second hard mask pattern 112 formed on the tops of the first region 111a and the second region 111b. In particular, the second hard mask pattern 112 formed on the bottom of the second region 111b is removed earlier than the second hard mask pattern 112 formed on the bottom of the first region 111a because the second hard mask pattern 112 formed on the bottom of the second region 111b is thinner than the second hard mask pattern 112 formed on the bottom of the first region 111a. Accordingly, the junction 100a of the second region 111b is exposed.

If the junction 100a of the second region 111b is exposed, over etch is performed on the second hard mask pattern 112 using an etch process having a high etch selectivity with respect to silicon as compared to an oxide layer to the extent that the height of the second hard mask pattern 112 is not lower than a depth of the junction 100a. Accordingly, the migration of electrons through a subsequent junction 100a can be prohibited. At this time, the second hard mask pattern 112 formed on the bottom of the first region 111a remains thin, and the second hard mask pattern 112 formed on an upper side of the third region 111c remains thick, so that the underlying void 113 is not exposed.

Figure 1E:
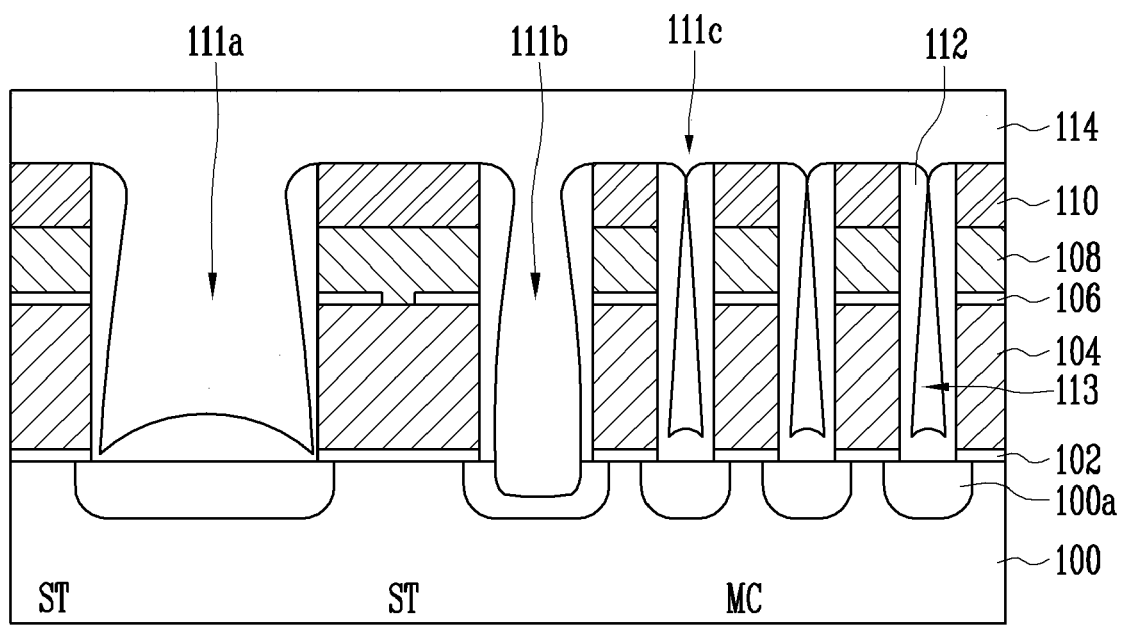

Referring to FIG. 1E, a second insulating layer 114 for an interlayer insulating layer is formed so that the first region 111a and the second region 111b are gap-filled. The third region 111c is occluded by the second hard mask pattern 112, so that the second insulating layer 114 is not formed within the void 113. The third insulating layer 114 may be formed from an Inter-Layer Dielectric (ILD) film.

Through the above technique, the semiconductor substrate between the select transistor ST and an adjacent memory cell MC is over etched. Thus, the migration distance of electrons from the select transistor ST to the memory cell MC is lengthened and therefore a program disturbance characteristic can be improved.

As described above, the select transistors and the memory cells are formed, the junctions are formed in the semiconductor substrate, and the semiconductor substrate between the select transistor and an adjacent memory cell are over etched using the hard mask pattern. Accordingly, migration of electrons can be prohibited and a program disturbance characteristic can be improved.

Further, a void is formed between the memory cells. Accordingly, an interference phenomenon between the memory cells can be reduced and therefore the reliability of a flash memory device can be improved.

What is claimed is:

1. A method of fabricating a flash memory device, the method comprising:

providing a semiconductor substrate comprising a select transistor and memory cells having junctions, wherein a width between of the memory cells is smaller than a width between the select transistor and a memory cell that is adjacent to the select transistor;

forming a hard mask pattern on a surface of the select transistor, the memory cells, and the semiconductor substrate to generate an overhang, wherein voids are formed between the memory cells due to the overhang;

performing a first etch process to remove a portion of the hard mask pattern formed on a bottom between the select transistor and the memory cells, thus exposing the junctions;

performing a second etch process to remove a portion of the junction formed between the select transistor and the memory cells, without removing the voids between the memory cells; and forming an insulating layer to gap-fill regions between the adjacent select transistor and memory cells.

2. The method of claim 1, comprising forming the hard mask pattern with a layer having poor step coverage.

3. The method of claim 2, wherein the layer having poor step coverage is selected from the group consisting of an Undoped Silicate Glass (USG) layers and Tetra Ethyl Ortho Silicate (TEOS) layers.

4. The method of claim 1, comprising forming the hard mask pattern to a thickness of 800 angstroms to 1000 angstroms.

5. The method of claim 1, comprising forming the hard mask pattern such that the hard mask pattern, which is formed on the bottom between the select transistor and the memory cell, is thinner than that formed on top surfaces of the select transistor and the memory cell.

6. The method of claim 1, wherein the bottom between the select transistor and the memory cell is lower than a top surface of the semiconductor substrate, and higher than the junction after performing a second etch process.

7. The method of claim 1, wherein the first etch process comprises performing a dry etch process.

8. A method of fabricating a flash memory device, the method comprising:

providing a semiconductor substrate comprising select lines and word lines having junctions formed in the semiconductor substrate, wherein a width between the word lines is smaller than a width between a select line and a word line that is adjacent to the select line, and the width between the select line and the word line is smaller than a width between adjacent select lines;

forming a hard mask pattern on a surface of the select lines, the word lines, and the semiconductor substrate including the junctions to generate an overhang, wherein voids are formed between the word lines due to the overhang;

performing a first etch process to expose the junction between the select line and the word line which is adjacent to the select line;

performing a second etch process to remove a portion of the junction formed between the adjacent select line and word line, without removing the voids between the word lines, and without removing the hard mask pattern formed on the junction between the adjacent select lines; and forming an insulating layer on the semiconductor substrate including the select lines, the word lines, and the junctions.

9. The method of claim 8, wherein the hard mask pattern is selected from the group consisting of Undoped Silicate Glass (USG) layers and Tetra Ethyl Ortho Silicate (TEOS) layers.

10. The method of claim 8, wherein each of the first etch process and the second etch process comprises performing a dry etch process.

11. The method of claim 8, wherein a bottom between the select line and the word line is lower than a top surface of the semiconductor substrate, and higher than the junction after performing a second etch process.

* * * * *